United States Patent
Fujii

(10) Patent No.: US 10,077,882 B2
(45) Date of Patent: Sep. 18, 2018

(54) LIGHT EMITTING DEVICE, SURFACE LIGHT SOURCE DEVICE AND DISPLAY APPARATUS

(71) Applicant: Enplas Corporation, Saitama (JP)

(72) Inventor: Yuki Fujii, Saitama (JP)

(73) Assignee: ENPLAS CORPORATION, Tokyo (JP)

( * ) Notice: Subject to any disclaimer, the term of this patent is extended or adjusted under 35 U.S.C. 154(b) by 154 days.

(21) Appl. No.: 15/079,950

(22) Filed: Mar. 24, 2016

(65) Prior Publication Data

US 2016/0281957 A1     Sep. 29, 2016

(30) Foreign Application Priority Data

Mar. 27, 2015   (JP) ................... 2015-066061

(51) Int. Cl.
| | | |
|---|---|---|
| G09F 13/04 | (2006.01) |
| F21V 5/04 | (2006.01) |
| G02B 19/00 | (2006.01) |
| F21V 5/00 | (2018.01) |
| H01L 33/58 | (2010.01) |

(52) U.S. Cl.
CPC ............ F21V 5/04 (2013.01); F21V 5/045 (2013.01); G02B 19/0061 (2013.01); *F21V 5/00* (2013.01); *H01L 33/58* (2013.01)

(58) Field of Classification Search
CPC .... F21V 5/04; F21V 5/045; F21V 5/00; G02B 19/0061; H01L 33/58
See application file for complete search history.

(56) References Cited

U.S. PATENT DOCUMENTS

| 2009/0045416 A1 | 2/2009 | Bierhuizen et al. | |
|---|---|---|---|
| 2015/0241004 A1* | 8/2015 | Oberschmid | F21K 9/60 |
| | | | 362/84 |
| 2015/0276170 A1* | 10/2015 | Motoyanagi | F21V 5/04 |
| | | | 362/335 |

FOREIGN PATENT DOCUMENTS

| JP | 2010-537400 A | 12/2010 |
|---|---|---|
| JP | 2013-218940 A | 10/2013 |

* cited by examiner

*Primary Examiner* — Y M. Lee
(74) *Attorney, Agent, or Firm* — Brundidge & Stanger, P.C.

(57) ABSTRACT

A light emitting device includes a light emitting element emitting light from a top surface and a side surface, and a light flux controlling member controlling distribution of light emitted therefrom. The light flux controlling member includes a rear surface, an incidence surface, and an emission surface. When opening diameter of recess is φ, maximum length of the light emitting element in plan view is L, and thickness of the light emitting element is t, diameter φ is equal to or more than twice a distance from a point where illuminance of light emitted from the side surface thereof to reach the substrate is maximum in illuminance distribution on the substrate to central axis of the light flux controlling member, and is less than "L+12t."

6 Claims, 7 Drawing Sheets

LIGHT EMITTING DEVICE, SURFACE LIGHT SOURCE DEVICE AND DISPLAY APPARATUS

CROSS REFERENCE TO RELATED APPLICATIONS

This application is entitled to and claims the benefit of Japanese Patent Application No. 2015-066061, filed on Mar. 27, 2015, the disclosure of which including the specification, drawings and abstract is incorporated herein by reference in its entirety.

TECHNICAL FIELD

The present invention relates to a light emitting device having a light emitting element and a light flux controlling member, a surface light source device and a display apparatus having the light emitting device.

BACKGROUND ART

Some transmissive image display apparatuses such as liquid crystal display apparatuses use a direct surface light source device. In recent years, surface light source devices having a plurality of light emitting elements as the light sources have been used.

For example, the surface light source device includes a substrate, a plurality of light emitting elements, a plurality of light flux controlling members, and a diffusion plate. The plurality of light emitting elements is disposed on the substrate in a matrix. The light flux controlling member for expanding light emitted from each of the light emitting elements in the plane direction of the substrate is disposed over each of the light emitting elements. The light emitted from each of the light emitting elements is diffused by the light flux controlling member to irradiate a member to be irradiated (e.g., liquid crystal panel) in a planar manner (see, e.g., PTL 1).

FIG. 1 illustrates a configuration of a back light device (surface light source device) disclosed in PTL 1. As illustrated in FIG. 1, back light device 10 disclosed in PTL 1 includes mounting substrate 20, package 30 disposed on mounting substrate 20 and emitting light through its upper surface, diffusion lens (light flux controlling member) 40 disposed on mounting substrate 20 in such a manner as to cover package 30 to control the distribution of light emitted from package 30, and diffusion plate 50 that transmits light emitted from diffusion lens 40 while diffusing the light. Diffusion lens 40 has lens part 41 for expanding light emitted from package 30, and fixing part 42 for fixing lens part 41 to mounting substrate 20 via adhesive 46. Lens part 41 has bottom surface 43 closer to mounting substrate 20, recessed light incidence surface 44 opening toward bottom surface 43, and light emission surface 45 disposed opposite to light incidence surface 44.

The light emitted from package 30 enters diffusion lens 40 through light incidence surface 44. The light having entered diffusion lens 40 is emitted toward the outside of diffusion lens 40 through light emission surface 45. Then, the light emitted toward the outside is transmitted through diffusion plate 50 while being diffused to thereby irradiate a member to be irradiated in a planar manner.

In addition, PTL 2 discloses a flip-chip type LED that emits light from the side surface. The LED disclosed in PTL 2 is designed to emit light from the side surface by disposing a reflective film on the upper surface of a phosphor layer that emanates light.

CITATION LIST

Patent Literature

PTL 1
Japanese Patent Application Laid-Open No. 2013-218940
PTL 2
Japanese Unexamined Patent Application Publication (Translation of PCT Application) No. 2010-537400

SUMMARY OF INVENTION

Technical Problem

Back light device 10 disclosed in PTL 1 optimizes the efficiency of the incidence of light emitted from package 30 and entering diffusion lens 40 by disposing diffusion lens 40 over the upper surface of package 30. On the other hand, there is a possibility for many reasons that the LED that emits light from the side surface as disclosed in PTL 2 may be installed in back light device 10 disclosed in PTL 1.

However, when the LED disclosed in PTL 2 is installed in back light device 10 disclosed in PTL 1, the LED disclosed in PTL 2 emits light from the side surface, and thus a part of the light emitted from the side surface of the LED reaches mounting substrate 20. Then, a part of the light having reached mounting substrate 20 is reflected toward bottom surface 43 of diffusion lens 40. The light having reached bottom surface 43 is refracted upward to enter the inside of diffusion lens 40. The light propagating upward inside diffusion lens 40 is emitted out of diffusion lens 40 upward through light emission surface 45. The light emitted toward the outside reaches diffusion plate 50 to generate a bright part. Thus, when the LED disclosed in PTL 2 is installed in back light device 10 disclosed in PTL 1, the light having entered diffusion lens 40 through bottom surface 43 undesirably generates a bright part at a portion immediately above diffusion lens 40.

Generally, a bright part generated at a portion immediately above diffusion lens 40 is eliminated by reducing the curvature radius of light incidence surface 44 at its apex. Light having entered near the apex of light incidence surface 44, which has a smaller curvature radius, is refracted so as to be expanded sideward, when compared to the case where the light enters near the apex of light incidence surface 44, which has a larger apex curvature radius. Accordingly, the bright part generated at the portion immediately above can be eliminated by forming light incidence surface 44 so as to have a smaller curvature radius at the apex thereof.

When recessed light incidence surface 44 is thus formed so as to have a smaller curvature radius at its apex, the opening diameter of the opening of light incidence surface 44 becomes smaller, so that the distance between the LED and the opening edge becomes closer. Accordingly, as described above, when the curvature radius of light incidence surface 44 at its apex is reduced, with the LED disclosed in PTL 2 being installed in back light device 10 disclosed in PTL 1, the amount of light that enters through bottom surface 43 is undesirably increased, and an unintended bright part is undesirably generated at a portion immediately above diffusion lens 40.

Here, in order to reduce the amount of light that enters through bottom surface 43, it is effective to increase the opening diameter at bottom surface 43. However, when the opening diameter is increased unnecessarily, the curvature radius of light incidence surface 44 at its apex undesirably becomes larger, causing the original diffusing function of diffusion lens 40 to be lowered.

Thus, it has been difficult to achieve both the control of light that enters through light incidence surface 44 and the reduction of the amount of light that enters through bottom surface 43.

In light of the above circumstances, an object of the present invention is to provide a light emitting device having a light emitting element configured to emit light at least from a top surface and a side surface and being capable of controlling light emitted from the light emitting element to have a desired light distribution. In addition, another object of the present invention is to provide a surface light source device and a display apparatus having the light emitting device.

Solution to Problem

In order to achieve the above-mentioned object, a light emitting device of the present invention includes: a light emitting element disposed on a substrate and configured to emit light at least from a top surface and a side surface; and a light flux controlling member disposed so as to intersect an optical axis of the light emitting element to control a distribution of light emitted from the light emitting element, in which the light flux controlling member includes: a rear surface disposed apart from the substrate; an incidence surface being disposed so as to contain the light emitting element when viewed in plan view, being an inner surface of a recess opening on the rear surface, and being a surface on which light emitted from the light emitting element is incident; and an emission surface configured to emit at least a part of the light incident through the incidence surface toward an outside, and when an opening diameter of the recess is set as φ; a maximum length of the light emitting element when viewed in plan view is set as L; and a thickness of the light emitting element is set as t, the diameter φ is equal to or more than twice a distance from a point where an illuminance of light emitted from the side surface of the light emitting element to reach the substrate is maximum in illuminance distribution on the substrate to a central axis of the light flux controlling member, and is less than "L+12t."

In addition, in order to achieve the above-mentioned object, a surface light source device of the present invention includes the light emitting device of the present invention, and a light diffusing member which transmits light from the light emitting device while diffusing the light.

Further, in order to achieve the above-mentioned object, a display apparatus of the present invention includes the surface light source device of the present invention, and a display member to be irradiated with light emitted from the surface light source device.

Advantageous Effects of Invention

According to the present invention, even when using a light emitting element that emits light at least from a top surface and a side surface, it is possible to control light emitted from the light emitting element to have a desired light distribution.

DESCRIPTION OF EMBODIMENTS

Hereinafter, embodiments of the present invention will be described in detail with reference to the accompanying drawings. In the following description, as a typical example of the surface light source device according to the present invention, a surface light source device suitable as a back light of a liquid crystal display apparatus will be described. When used with a display member (e.g., liquid crystal panel) to be irradiated with light from the surface light source device, the surface light source device can be used as a display apparatus.

(Configurations of Surface Light Source Device and Light Emitting Device)

Figure 1:
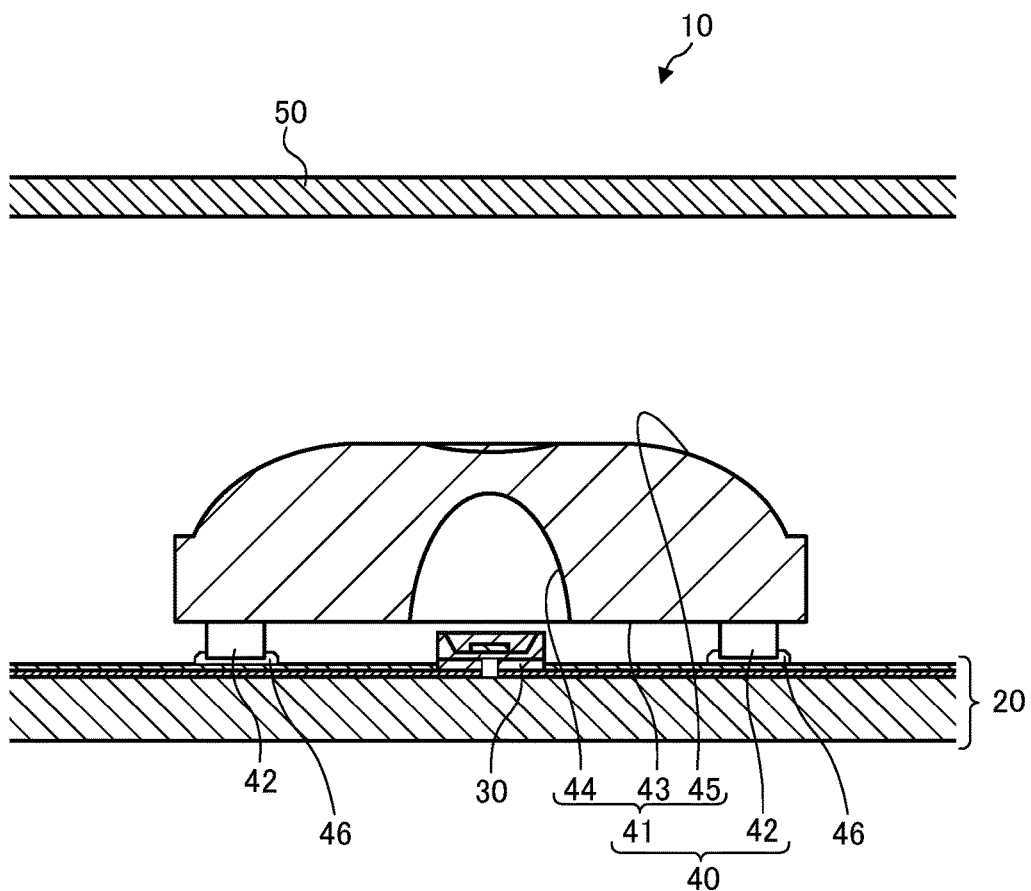
FIG. 1 illustrates a configuration of a back light device disclosed in PTL 1.
Figure 2A:
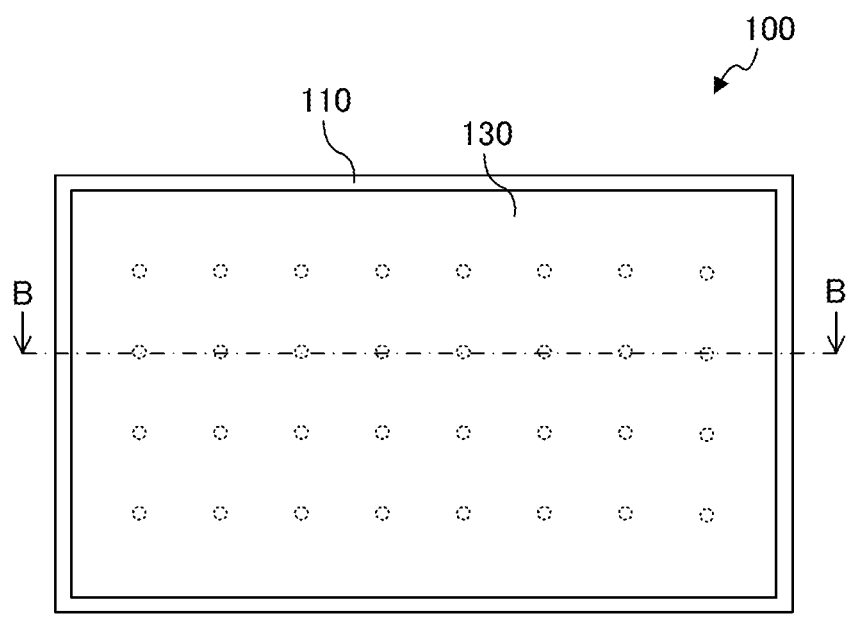
FIGS. 2A and 2B illustrate a configuration of a surface light source device according to an embodiment of the present invention.
Figure 2B:
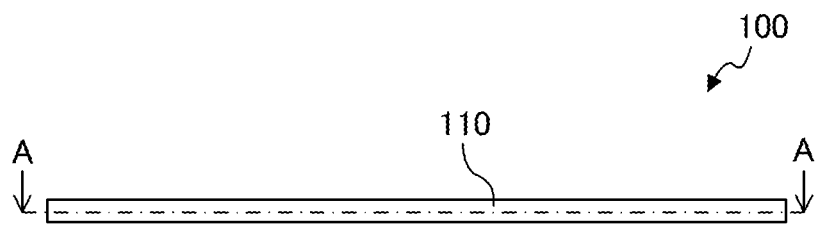
Figure 3A:
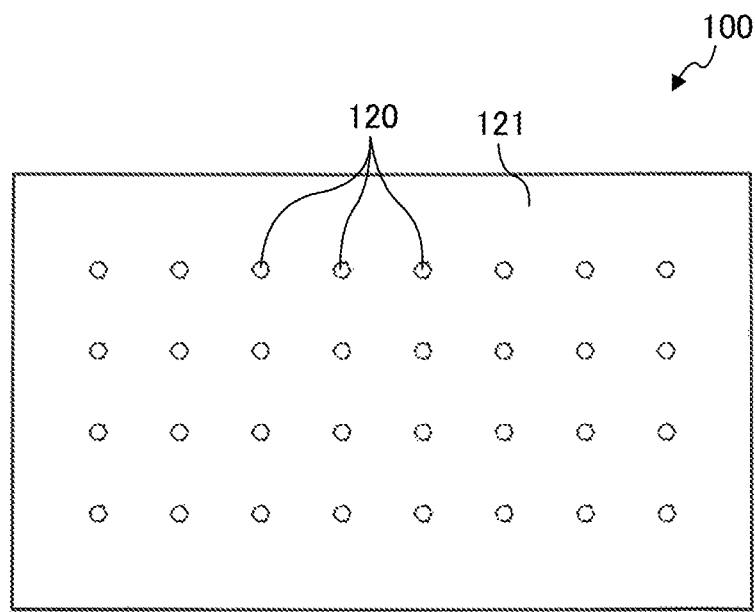
FIGS. 3A and 3B are cross-sectional views of the surface light source device according to the present embodiment.
Figure 3B:
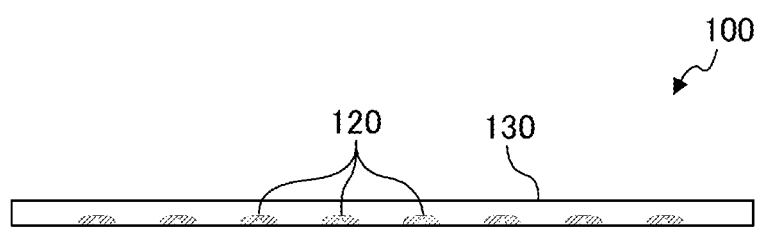
Figure 4:
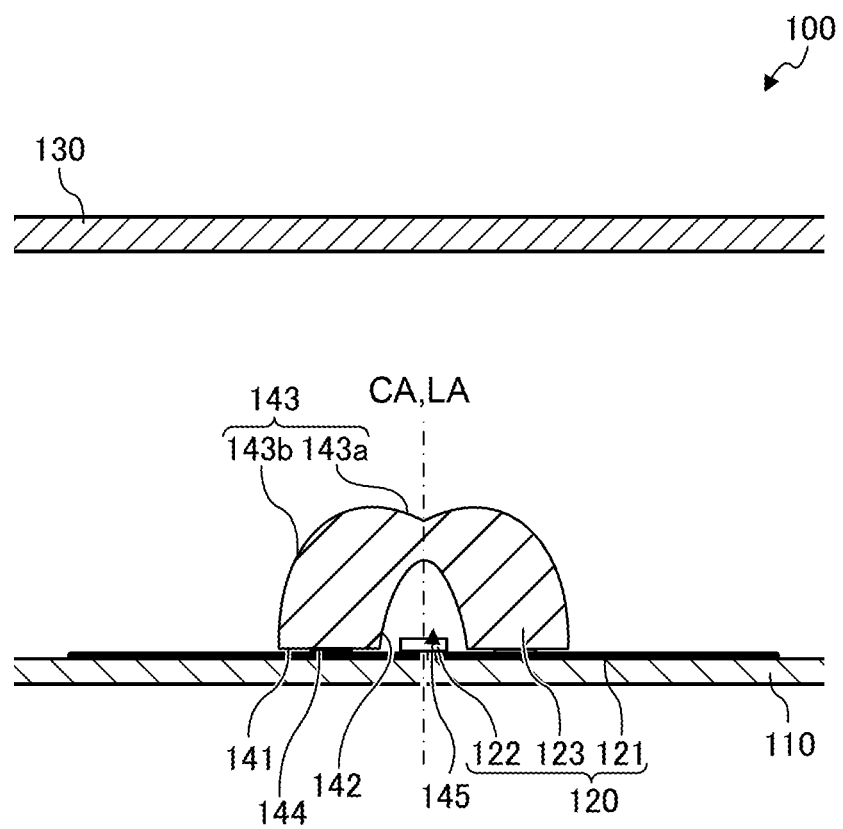
FIG. 4 is a partially enlarged cross-sectional view of the surface light source device according to the present embodiment.

FIGS. 2A, 2B, 3A, 3B, and 4 illustrate the configuration of surface light source device 100 according to an embodiment of the present invention. FIG. 2A is a plan view of surface light source device 100, and FIG. 2B is a side view of surface light source device 100. FIG. 3A is a cross-sectional view taken along line A-A illustrated in FIG. 2B, and FIG. 3B is a cross-sectional view taken along line B-B illustrated in FIG. 2A. FIG. 4 is a partially enlarged cross-sectional view in which a part of FIG. 3B is enlarged.

As illustrated in FIGS. 2A, 2B, 3A, 3B, and 4, surface light source device 100 according to the present embodiment includes casing 110, a plurality of light emitting devices 120, and light diffusing member 130. The top plate of casing 110 is provided with an opening. Light diffusing member 130 is disposed in such a manner as to cover the opening of casing 110, and functions as a light emitting surface. The size of the light emitting surface is, for example, about 400 mm×about 700 mm (32 inches), although the size thereof is not particularly limited.

Light diffusing member 130 is a plate-like member having a light diffusing property, and transmits light emitted from light emitting device 120 while diffusing the light. Typically, the size of light diffusing member 130 is substantially the same as that of a member to be irradiated, such as a liquid crystal panel. For example, light diffusing member 130 is formed of light-transmissive resins such as polymethylmethacrylate (PMMA), polycarbonate (PC), polystyrene (PS), and styrene methyl methacrylate copolymerization resin (MS). In order to provide a light diffusing property, fine irregularities are formed on the surface of light diffusing member 130, or light diffusers such as beads are dispersed inside light diffusing member 130.

As illustrated in FIG. 4, each of the plurality of light emitting devices 120 has substrate 121, light emitting element 122, and light flux controlling member 123.

Substrate 121 is a tabular member. Substrate 121 supports light emitting element 122 and light flux controlling member 123. Substrate 121 is disposed on the top of the bottom plate of casing 110, and the plurality of light emitting devices 120 are disposed at certain intervals on the bottom plate of casing 110.

Light emitting element 122 is a light source of surface light source device 100, and is disposed on substrate 121. The type of light emitting element 122 is not particularly limited, insofar as light emitting element 122 is a light source that emits light at least from a top surface and a side surface thereof. In the present embodiment, light emitting element 122 is a flip-type light emitting diode (LED) that emits light from a top surface and a side surface thereof. Further, the shape of light emitting element 122 is not particularly limited insofar as light emitting element 122 can emit light at least from a top surface and a side surface thereof. Examples of the shape of light emitting element 122 include a prism shape and a cylindrical shape. In the present embodiment, the shape of light emitting element 122 is a quadrangular prism. For example, light emitting element 122 has the size of 1.4 mm in width×1.4 mm in depth×0.4 mm in thickness.

Light flux controlling member 123 is a diffusion lens that controls the distribution of light emitted from light emitting element 122, and is disposed on substrate 121. Light flux controlling member 123 is disposed over light emitting element 122 such that its central axis CA coincides with optical axis LA of light emitting element 122. A gap is formed between the surface of substrate 121 on which light emitting element 122 is mounted and rear surface 141 of light flux controlling member 123, for releasing heat generated from light emitting element 122 to the outside. As used herein, the term "optical axis LA of light emitting element" means the central light beam of a three-dimensional light flux from the top surface of light emitting element 122.

Light flux controlling member 123 is formed by integral molding. The material for light flux controlling member 123 is not particularly limited insofar as the light of a desired wavelength can pass through the material. Examples of the material for light flux controlling member 123 include light-transmissive resins such as polymethylmethacrylate (PMMA), polycarbonate (PC) and epoxy resin (EP), and glass.

Light emitted from light emitting element 122 is expanded in the radial direction (direction away from central axis CA) by light flux controlling member 123. The effect is remarkable in light having a small angle relative to central axis CA among light fluxes emitted from light emitting element 122. Light emitted from light emitting device 120 reaches light diffusing member 130. The light having reached light diffusing member 130 is transmitted through light diffusing member 130 while being diffused.

(Configuration of Light Flux Controlling Member)

As illustrated in FIG. 4, light flux controlling member 123 includes rear surface 141, incidence surface 142, emission surface 143, and a plurality of legs 144.

Rear surface 141 is a planar surface disposed apart from substrate 121 on the lower side (light emitting element 122 side) of light flux controlling member 123. While interval 1 (see FIG. 5A) between substrate 121 and rear surface 141 is not particularly limited insofar as a gap is formed for releasing heat generated from light emitting element 122 to the outside, interval 1 is preferably less than thickness t of light emitting element 122. The central portion of rear surface 141 has recess 145. Recess 145 is disposed so as to intersect central axis CA. An area except recess 145 of rear surface 141 has a plurality of legs 144 being disposed thereon at equal distances along the circumferential direction.

Incidence surface 142 is the inner surface of recess 145. Incidence surface 142 allows light emitted from light emitting element 122 to enter the inside of light flux controlling member 123 while controlling the propagation direction of the light. Incidence surface 142 of light flux controlling member 123 is the principal feature of light emitting device 120 according to the present invention, and thus will be described later in detail.

Emission surface 143 is configured to emit light having entered the inside of light flux controlling member 123 through incidence surface 142 to the outside while controlling the propagation direction of the light. Emission surface 143 is disposed on light diffusing member 130 side so as to intersect central axis CA and protrudes upward (light diffusing member 130 side).

Emission surface 143 has first emission surface 143a positioned in a predetermined range about central axis CA of light flux controlling member 123 and second emission surface 143b formed continuously around first emission surface 143a.

First emission surface 143a is disposed at a position to intersect central axis CA of light flux controlling member 123 (optical axis LA of light emitting element 122), and is formed so as to be convex downward (toward light emitting element 122). First emission surface 143a may be either formed into an entirely convex curved surface, or formed such that the generatrix line of first emission surface 143a from the central axis toward the outer edge portion is a curve concave downward (toward light emitting element 122) (convex upward (toward light diffusing member 130)). In the present embodiment, first emission surface 143a is formed such that the generatrix line of first emission surface 143a from the central axis toward the outer edge portion is a curve concave downward (toward light emitting element 122).

Second emission surface 143b is a curved surface entirely convex (convex curved surface) upward (toward light diffusing member 130) positioned so as to surround first emission surface 143a. The shape of second emission surface 143b is such an entirely convex shape that a part of an annular surface is cut off. Noted that a third emission surface may be provided around second emission surface 143b, although not particularly illustrated. The third emission surface may be either linear or curved, in the cross-section including central axis CA.

Further, the boundary between first emission surface 143a and second emission surface 143b may be, for example, a middle point, along the direction of central axis CA, between the edge on the lower side (light emission element 122 side) of first emission surface 143a and the edge of the upper side (light diffusing member 130 side) of second emission surface 143b.

A plurality of legs 144 are cylindrical members at outer peripheral portions of rear surface 141, protruding downward (toward light emitting element 122) from rear surface 141. The plurality of legs 144 supports light flux controlling member 123 at suitable positions relative to light emitting element 122. As described above, a gap for releasing heat generated from light emitting element 122 to the outside is formed between substrate 121 and rear surface 141. That is, the height (length) h of leg 144 is a length which can secure a gap for releasing heat generated from light emitting element 122 to the outside. From the viewpoint of reducing the amount of light that enters the inside of light flux controlling member 123 through rear surface 141, the height h of leg 144 is preferably shorter than the above-mentioned thickness t of light emitting element 122.

Light flux controlling member 123 may have a flange, although not particularly illustrated. The flange is positioned between the outer peripheral portion of emission surface 143 and the outer peripheral portion of rear surface 141, and protrudes outwardly in the radial direction. The shape of the flange is substantially annular. While the flange is not always necessary, providing the flange makes it easier to handle and align light flux controlling member 123. The thickness of the flange is not particularly limited, and is determined taking account of an area required for emission surface 143, the molding property of the flange, or the like.

Among light emitted from light emitting element 122, most of the light enters the inside of light flux controlling member 123 through incidence surface 142. At that time, the incident light (in particular, light near optical axis LA) is expanded in the radial direction (direction away from optical axis LA of light emitting element 122) due to the shape of incidence surface 142. Light having entered the inside of light flux controlling member 123 is emitted to the outside through emission surface 143. Also at that time, light from light emitting element 122 is further expanded in the radial direction (direction away from optical axis LA of light emitting element 122) due to the shape of emission surface 143. As a result, light emitting device 120 configured to emit light having been expanded smoothly in a wide angular range.

Figure 5A:
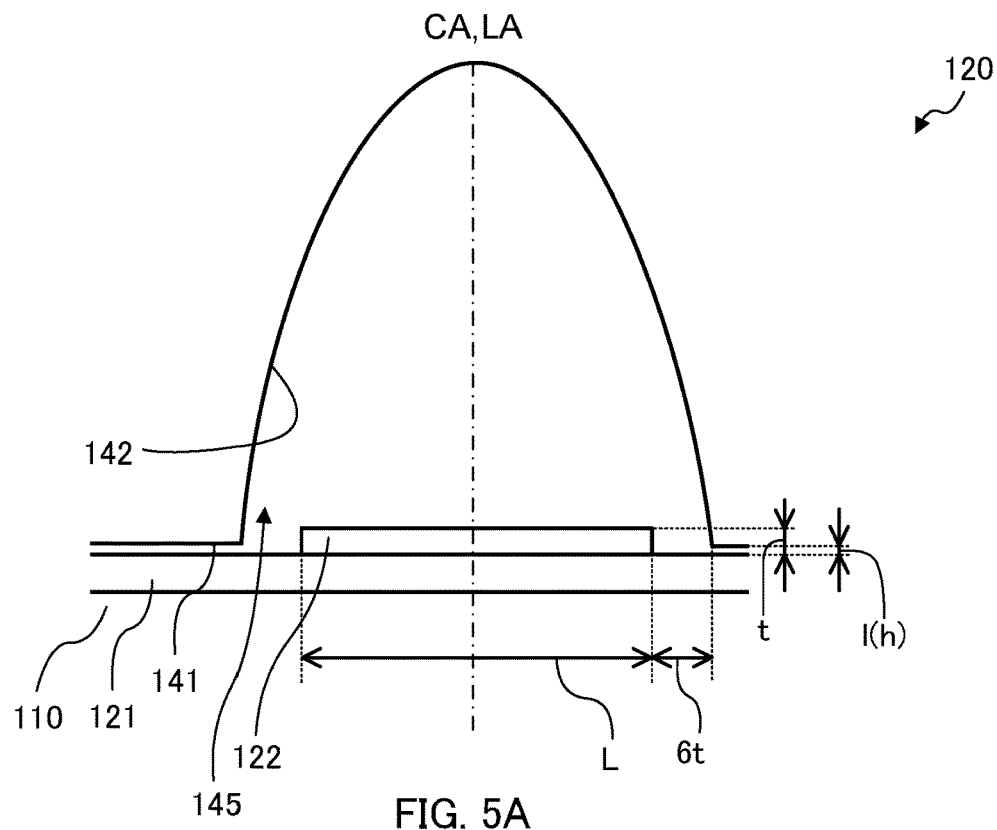
FIG. 5A is a partially enlarged cross-sectional view schematically illustrating a light emitting device according to the present embodiment, and 5B is a partially enlarged plan view schematically illustrating the light emitting device.
Figure 5B:
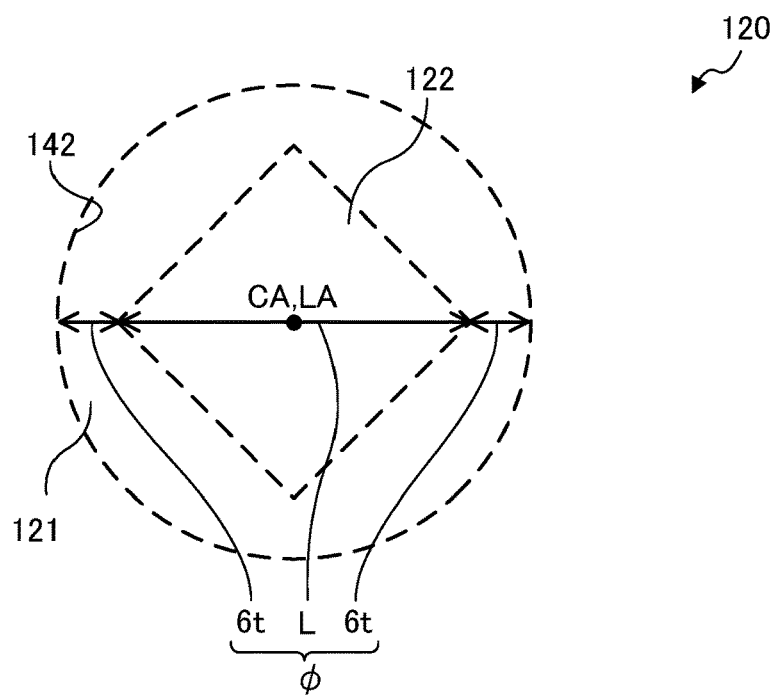

Here, the shape of incidence surface 142 will be described in detail, with reference to FIGS. 5A and 5B. FIG. 5A is a partially enlarged cross-sectional view schematically illustrating light emitting device 120, and 5B is a partially enlarged plan view schematically illustrating light emitting device 120. In FIG. 5A, hatching for light emitting element 122, substrate 121 and light flux controlling member 123 is omitted. As described above, incidence surface 142 is the inner surface of recess 145 disposed on light emitting element 122 side so as to intersect central axis CA, and allows light emitted from light emitting element 122 to enter the inside of light flux controlling member 123 while controlling the propagation direction of the light. In the present embodiment, the shape of incidence surface 142 is a substantially semi-elliptical shape in the cross-section including central axis CA. In addition, incidence surface 142 is also a rotationally symmetrical plane about central axis CA.

In light emitting device 120 according to the present embodiment, from the viewpoint of achieving both the proper control of light incident through incidence surface 142 and the reduction of light incident through rear surface 141, the opening diameter φ of recess 145 is set so as to be within a predetermined range. That is, when the opening diameter of recess 145 is set as φ, the maximum length of light emitting element 122 when viewed in plan view is set as L, and the thickness of light emitting element 122 is set as t, the diameter φ is equal to or more than twice the distance from a point where the illuminance of light emitted from the side surface of light emitting element 122 to reach substrate 121 is maximum in illuminance distribution on substrate 121 (or the bottom plate of casing 110) to central axis CA of light flux controlling member 123, and is less than "L+12t." As used herein, "the maximum length L of light emitting element when viewed in plan view" means the length of the longest line segment among line segments connecting arbitrary two points on the outer edge portion of light emitting element 122 when light emitting element 122 is viewed in plan view. For example, when the shape of light emitting element 122 in plan view is rectangular, the maximum length L is the length of a diagonal line, and when the shape of light emitting element 122 in plan view is circular, the maximum length L is the diameter of the circle.

When the opening diameter φ of recess 145 is less than the above-mentioned predetermined length, most of light emitted from the side surface of light emitting element 122 and reflected at substrate 121 undesirably enters through rear surface 141, causing a bright part to be generated at a portion immediately above light emitting device 120. On the other hand, when the opening diameter φ of recess 145 is "L+12t" or more, the percentage of light entering through incidence surface 142 among light emitted from the side surface of light emitting element 122 is increased, but the apex of recess 145 (incidence surface 142) becomes obtuse, which thus makes it impossible to properly control the propagation direction of light entering through the apex of recess 145 (incidence surface 142).

(Simulation)

Figure 6A:
FIG. 6A is a drawing for explaining conditions for a simulation of illuminance distribution.

First, the illuminance distribution, on substrate 121, of light emitted from the side surface of light emitting element 122 to reach substrate 121 was simulated. Specifically, as illustrated in FIG. 6A, in which the components illustrated in FIG. 5A other than substrate 121 and light emitting element 122 are omitted, the illuminance of each point on the surface of substrate 121 was calculated, on the assumption that light in Lambert distribution was emitted from the entire side surface of light emitting element 122 in the cross-section including optical axis LA of light emitting element 122. It is noted that light having reached substrate 12 was assumed to be absorbed without being reflected. Light emitting element 122 was set to have the size of 1.4 mm in width w×1.4 mm in depth d×0.4 mm in thickness t. In this case, the maximum length L of light emitting element 122 is 1.98 mm.

Figure 6B:
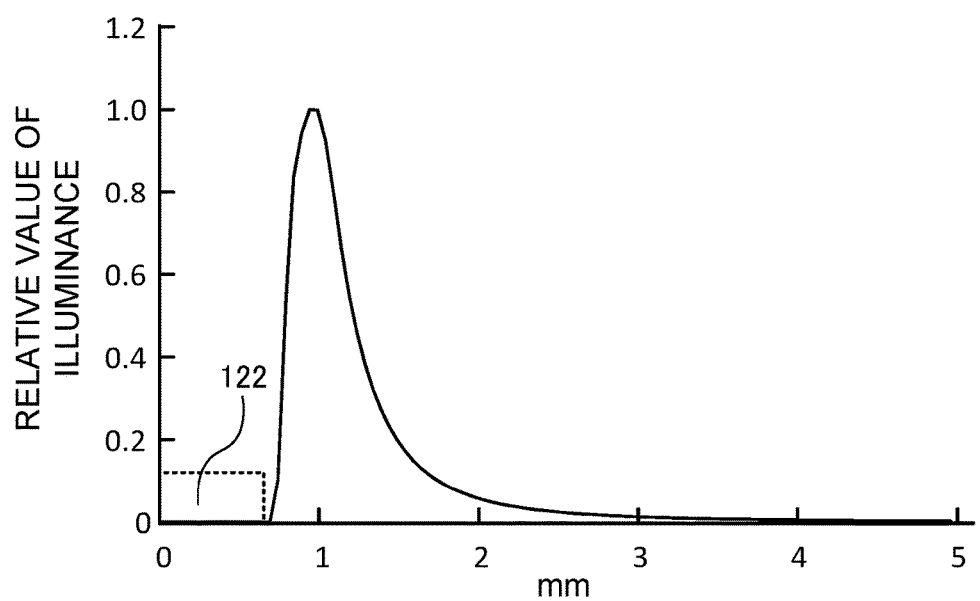
FIG. 6B is a graph illustrating results of the simulation of illuminance distribution.

FIG. 6B is a graph illustrating the results of the simulation. The abscissa indicates the distance (mm) from optical axis LA of light emitting element 122 (central axis CA of light flux controlling member 123) in the cross-section including optical axis LA of light emitting element 122, and the ordinate indicates the relative value (with the maximum value set as 1) of illuminance (lux).

As illustrated in FIG. 6B, in the present simulation, the illuminance of light irradiated onto substrate 121 at a position 0.94 mm distant from the center of light emitting element 122 was maximum. In a light emitting device using light emitting element 122 configured to emit light from the side surface, such as light emitting device 120 according to the present embodiment, the position on substrate 121 where light emitted from the side surface of light emitting element 122 reaches varies depending on the size (maximum length L) and thickness t of light emitting element 122. Accordingly, in light emitting device 120 according to the present embodiment, the opening diameter φ of recess 145 (incidence surface 142) of light flux controlling member 123 is set, taking account of the maximum L and thickness t of light emitting element 122 to be used. That is, for light emitting element 122 used in the simulation, the opening diameter φ of recess 145 is set at 1.88 mm (=0.94 mm×2) or more, and less than 6.78 mm (=1.98 mm+12×0.4 mm) (L+12t).

(Experiment)

Next, the luminance distribution of light emitting device 120 according to the present embodiment was actually measured. In the present experiment, in a light emitting device having light emitting element 122 disposed on substrate 121 and a light flux controlling member (any of light flux controlling members A to G) fixed to substrate 121, the luminance of light emitted from the light flux controlling member in the direction along optical axis LA of light emitting element 122 was measured using a two-dimensional color luminance meter. The size of light emitting element 122 is the same as that in the simulation (1.4 mm in width w×1.4 mm in depth d×0.4 mm in thickness t). Light flux controlling members A to G differ from each other only in the opening diameter φ of recess 145. Note that light flux controlling member E differs from others also in that a cone-shaped convex is formed at the central portion of the first emission surface. The opening diameters φ of the recesses of light flux controlling members A to G are, respectively, 2.30 mm, 2.70 mm, 3.02 mm, 3.35 mm, 3.43 mm, 3.52 mm, and 3.87 mm. Further, the distance between the surface of substrate 121 and the rear surface of light flux controlling member is 0.1 mm.

Figure 7A:
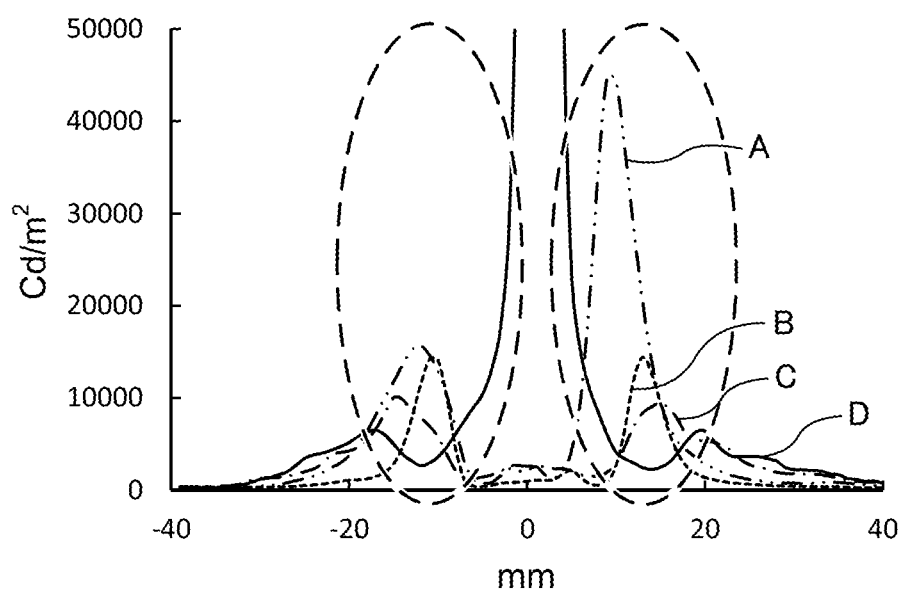
FIGS. 7A and B are graphs illustrating measurement results of luminance in the light emitting device according to the present embodiment.
Figure 7B:
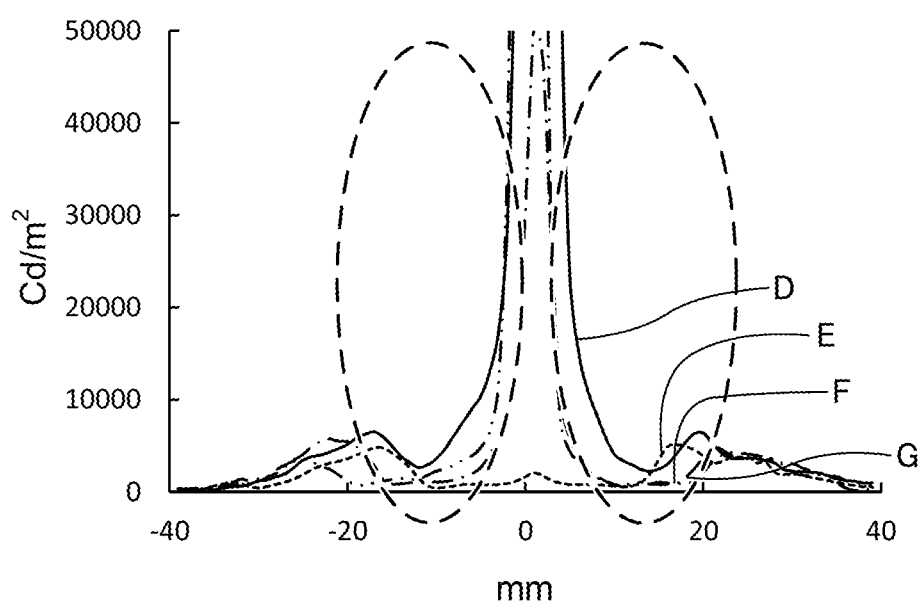

FIGS. 7A and 7B are graphs illustrating the luminance distribution of each light emitting device. In FIG. 7A, the two-dot chain line indicates the result of a light emitting device having light flux controlling member A with opening diameter φ of 2.30 mm; the dotted line indicates the result of a light emitting device having light flux controlling member B with opening diameter φ of 2.70 mm; the dot chain line indicates the result of a light emitting device having light flux controlling member C with opening diameter φ of 3.02 mm; and the solid line indicates the result of a light emitting device having light flux controlling member D with opening diameter φ of 3.35 mm. In FIG. 7B, the solid line indicates the result of a light emitting device having light flux controlling member D with opening diameter φ of 3.35 mm (the same as the solid line in FIG. 7A); the dotted line indicates the result of a light emitting device having light flux controlling member E with opening diameter φ of 3.43 mm; the dot chain line indicates the result of a light emitting device having light flux controlling member F with opening diameter φ of 3.52 mm; and the two-dot chain line indicates the result of a light emitting device having light flux controlling member G with opening diameter φ of 3.87 mm. In FIGS. 7A and B, the abscissa in indicates the distance (mm) from central axis CA of the light flux controlling member, and the ordinate indicates luminance (cd/m²). The areas encircled by broken lines illustrated in FIGS. 7A and 7B indicate peaks derived from light emitted from the side surface of light emitting element 122 to enter through the rear surfaces of light flux controlling members A to G; an object of light emitting device 120 according to the present embodiment is to reduce the peak which may be the cause of the occurrence of a bright part. It is noted that the peaks seen near central axis CA of light flux controlling members D, F and G illustrated in FIGS. 7A and 7B indicate light emitted from light emitting element 122 and propagating through the apex of incidence surface 142 and the central axis of the emission surface to be emitted. A larger curvature radius at the apex of incidence surface 142 tends to give larger peaks seen near central axis CA, although differences occur due to the attachment error at the time of mounting the light emitting element and the light flux controlling member on the substrate. Accordingly, when confirming the effects of the invention based on FIGS. 7A and 7B, confirming only the peaks within the areas encircled by the broken lines is sufficient.

As shown in the areas encircled by the broken lines in FIGS. 7A and 7B, it can be understood that, as the opening diameter φ increases, there is less light which enters through the rear surfaces of light flux controlling members A to G to be emitted toward immediately above light flux controlling members A to G, respectively. It can be understood, from this result, that the increase in the opening diameter φ makes it possible to suppress the occurrence of a bright part at a portion immediately above the light flux controlling member caused by light entering through the rear surface of the light flux controlling member. It is noted that, no peak seen near central axis CA was detected in the light emitting device having light flux controlling member E, since it controls light emitted from the vicinity of central axis CA sideward with the convex formed at the central portion of the first emission surface. Also taking into consideration the inclination of incidence surface 142 at the apex thereof, it is suggested that light emitting device 120 using any one of light flux controlling members A to G in which the opening diameter φ of recess 145 is set within a predetermined range is capable of achieving both the proper control of light that enters through light incidence surface 142 and the reduction of light that enters through bottom surface 141.

(Effect)

As has been described above, light emitting device 120 according to the present invention is capable of controlling light emitted from light emitting element 122 to have a desired light distribution, since the opening diameter φ of recess 145 is equal to or more than twice the distance from a point where the illuminance of light emitted from the side surface of light emitting element 122 to reach substrate 121 is maximum in illuminance distribution on the substrate to central axis CA of light flux controlling member 123, and is less than "L+12t."

INDUSTRIAL APPLICABILITY

The light emitting device and the surface light source device according to the present invention are applicable, for example, to a back light of a liquid crystal display apparatus, or a generally-used illumination apparatus.

REFERENCE SIGNS LIST

10 Back light device
20 Mounting substrate
30 Package
40 Diffusion lens
41 Lens part
42 Fixing part
43 Bottom surface
44 Light incidence surface
45 Light emission surface
46 Adhesive
50 Diffusion plate
100 Surface light source device
110 Casing
120 Light emitting device
121 Substrate
122 Light emitting element
123 Light flux controlling member
130 Light diffusing member
141 Rear surface
142 Incidence surface

143 Emission surface
143*a* First emission surface
143*b* Second emission surface
144 Leg
145 Recess
CA Central axis of light flux controlling member
LA Optical axis of light emitting element

The invention claimed is:

1. A light emitting device comprising:
a light emitting element disposed on a substrate and configured to emit light at least from a top surface and a side surface; and
a light flux controlling member disposed so as to intersect an optical axis of the light emitting element to control a distribution of light emitted from the light emitting element, wherein:
the light flux controlling member expands, in a direction away from a central axis of the light flux controlling member, the light emitted from the light emitting element;
the light flux controlling member includes:
a rear surface disposed apart from the substrate,
an incidence surface being disposed so as to contain the light emitting element when viewed in plan view, being an inner surface of a recess opening on the rear surface, and being a surface on which the light emitted from the light emitting element is incident, and
an emission surface configured to emit at least a part of the light incident through the incidence surface toward an outside; and
when an opening diameter of the recess is set as $\varphi$, a maximum length of the light emitting element when viewed in plan view is set as L, and a thickness of the light emitting element is set as t, the diameter $\varphi$ is equal to or more than twice a distance between the central axis of the light flux controlling member and a point where an illuminance of light reaching the substrate from the side surface of the light emitting element is maximum in illuminance distribution on the substrate, less than "L+12 t," and equal to or less than 1.95 times L.

2. The light emitting device according to claim 1, wherein an interval between the substrate and the rear surface is less than the thickness of the light emitting element.

3. A surface light source device comprising:
the light emitting device according to claim 1; and
a light diffusing member which transmits light from the light emitting device while diffusing the light.

4. A surface light source device comprising:
the light emitting device according to claim 2; and
a light diffusing member which transmits light from the light emitting device while diffusing the light.

5. A display apparatus comprising:
the surface light source device according to claim 3; and
a display member to be irradiated with light emitted from the surface light source device.

6. A display apparatus comprising:
the surface light source device according to claim 4; and
a display member to be irradiated with light emitted from the surface light source device.

* * * * *